(12) United States Patent
Lee

(10) Patent No.: US 6,678,860 B1
(45) Date of Patent: Jan. 13, 2004

(54) INTEGRATED CIRCUIT MEMORY DEVICES HAVING ERROR CHECKING AND CORRECTION CIRCUITS THEREIN AND METHODS OF OPERATING SAME

(75) Inventor: Jung-bae Lee, Kyungk-do (KR)

(73) Assignee: Samsung Electronics Co., Ltd. (KR)

( * ) Notice: Subject to any disclaimer, the term of this patent is extended or adjusted under 35 U.S.C. 154(b) by 473 days.

(21) Appl. No.: 09/633,240

(22) Filed: Aug. 7, 2000

(30) Foreign Application Priority Data

Aug. 11, 1999 (KR) ........................................ 1999-32908

(51) Int. Cl.$^7$ .............................................. G11C 29/00
(52) U.S. Cl. ........................................ 714/763; 714/735
(58) Field of Search .......................... 714/718, 54, 723, 714/762, 6, 763, 758, 766, 702, 735

(56) References Cited

U.S. PATENT DOCUMENTS

| | | | |
|---|---|---|---|
| 4,903,268 A | | 2/1990 | Hidaka et al. .............. 371/40.1 |
| 5,127,014 A | | 6/1992 | Raynham ...................... 371/37 |
| 5,233,614 A | * | 8/1993 | Singh .......................... 714/723 |
| 5,469,450 A | * | 11/1995 | Cho et al. .................... 714/766 |
| 5,682,394 A | * | 10/1997 | Blake et al. ................. 714/763 |
| 6,009,548 A | * | 12/1999 | Chen et al. .................. 714/762 |
| 6,233,717 B1 | | 5/2001 | Choi ........................... 714/805 |
| 6,289,471 B1 | * | 9/2001 | Gordon ......................... 714/6 |

OTHER PUBLICATIONS

Kalter et al., "A 50–ns 16–Mb DRAM with a 10–ns Data Rate and On–Chip ECC," IEEE Journal of Solid–State Circuits, vol. 25, No. 3, Oct. 1990, pp. 1118–1127.

* cited by examiner

Primary Examiner—Albert Decady
Assistant Examiner—Mujtaba Chaudry
(74) Attorney, Agent, or Firm—Myers Bigel Sibley & Sajovec

(57) ABSTRACT

Integrated circuit memory devices include a memory cell array having therein a plurality of stored data bits and a plurality of parity bits generated from a plurality of write data bits received by the memory device during a write operation. The plurality of stored data bits and the plurality of parity bits may collectively form a word having a length of m+p bits, where m and p are integers. An error check circuit is provided that converts the plurality of stored data bits and the plurality of parity bits into a plurality of syndrome bits (e.g., Si) that designate a location of a bit error in the plurality of stored data bits when compared against the original write data bits. An error correction circuit is provided that uses the plurality of syndrome bits to correct an error in the plurality of stored data bits and generate a plurality of read data bits that match the plurality of original write data bits.

2 Claims, 5 Drawing Sheets

$P1 = D3 \oplus D5 \oplus D7$
$P2 = D3 \oplus D6 \oplus D7$
$P4 = D5 \oplus D6 \oplus D7$ $S1 = FDO3 \oplus FDO5 \oplus FDO7 \oplus FPO1$
$S2 = FDO3 \oplus FDO6 \oplus FDO7 \oplus FPO2$
$S4 = FDO5 \oplus FDO6 \oplus FDO7 \oplus FPO4$

INTEGRATED CIRCUIT MEMORY DEVICES HAVING ERROR CHECKING AND CORRECTION CIRCUITS THEREIN AND METHODS OF OPERATING SAME

RELATED APPLICATION

This application is related to Korean Application No. 99-32908, filed Aug. 11, 1999, the disclosure of which is hereby incorporated herein by reference.

FILED OF THE INVENTION

The present invention relates to semiconductor memory devices, and more particularly, to semiconductor memory devices having on-chip error correction capability.

BACKGOUND OF THE INVENTION

Due to the recent development of micro technology, semiconductor devices can be designed to be highly integrated and operate at high speed. Particularly for high integrated semiconductor memory devices, a high yield is desired.

A semiconductor memory device is composed of many memory cells. Among these memory cells, if even one memory cell does not properly operate, the overall semiconductor memory device cannot function properly. As the degree of integration of semiconductor memory devices increases, the probability that malfunction occurs in memory cells increases. Malfunction is caused by defects in the memory cells themselves or by soft errors resulting from the incidence of a particles. Malfunctioning damages the function of a semiconductor memory device and thus, is a principal cause of reduction in the yield of semiconductor memory devices.

To solve these problems, a technique of installing a redundancy circuit on a chip is widely used to substitute redundant cells for defective cells, thereby improving the yield. The redundancy circuit drives a redundancy memory cell block in which redundant cells are arranged in row and column directions, and selects a redundancy cell in the redundancy memory cell block for substituting for a defect cell. In other words, once an address signal designating a defective cell is input to the redundancy circuit, the redundancy circuit selects a redundancy memory cell for substituting for a normal memory cell having a defect.

In the conventional technology using the redundancy circuit, the number of redundancy memory cells is predetermined and the redundancy memory cells are disposed near to a memory cell block. In a case in which the number of defective cells exceeds the predetermined number of redundancy memory cells, some defective cells cannot be substituted for by redundancy memory cells. In such a case, a semiconductor memory device is finally determined to be bad and discarded. Accordingly, the improvement of the yield of semiconductor memory devices is limited.

There is another method of improving the yield of semiconductor memory devices. In this method, error check and correction (ECC) functions are installed in a semiconductor memory device. The technology related to the on-chip ECC is disclosed in U.S. Pat. No. 4,903,268. FIG. 1 of the '268 patent illustrates a syndrome generating circuit 7 that performs an exclusive-OR operation on the real check bits "e" and the write check bits "d".

U.S. Pat. No. 4,903,268 introduces a semiconductor memory device having on-chip ECC, in which data in a parity bit memory cell array can be independently accessed through switching means for external functionality testing of the parity bit memory cell array as well as a data bit memory cell array. The ECC of the U.S. Pat. No. 4,903,268 is usually effective in asynchronous semiconductor memory devices.

Another method for improving the yield of semiconductor memory devices is to combine the redundancy technique and the ECC technology, which is disclosed in an article by H. Kalter et al., entitled "A 50-ns 16-Mb DRAM with a 10-ns Data Rate and On-Chip ECC," IEEE Journal of Solid-State Circuits, Vol. 25, No. 5, pp. 1118–1127 (1990). According to the H. Kalter et al. article, among all the outputs of the bit line sense amplifiers, which are activated in response to the activation of a single word line, that is, among 1112 bits, except for 16 bits, 1096 bits of redundant bit lines are included in eight ECC words each of which is composed of 128 data bits and 9 parity bits. In this method, since the number of bits of a single ECC word is large, an arithmetic logic block, which is necessary for checking bits for errors and determining the bits are normal or erroneous, is large and operation time is also long. Consequently, the method is not suitable for rapid operation. Therefore, an ECC circuit which does not impede the rapid operation of a synchronous semiconductor memory device is required.

SUMMARY OF THE INVENTION

Preferred integrated circuit memory devices comprise a memory cell array having therein a plurality of stored data bits and a plurality of parity bits generated from a plurality of write data bits received by the memory device during a write operation. The plurality of stored data bits and the plurality of parity bits may collectively form a word having a length of m+p bits, where m and p are integers. An error check circuit is also provided. The error check circuit converts the plurality of stored data bits and the plurality of parity bits into a plurality of syndrome bits (e.g., Si) that designate a location of a bit error in the plurality of stored data bits when compared against the original write data bits. These write data bits may be received by an input buffer within the memory device and the stored data bits may have error therein (relative to the write data bits) that was generated during the write operation. These preferred memory devices also preferably comprise an error correction circuit that uses the plurality of syndrome bits to correct an error in the plurality of stored data bits and after the correction generate a plurality of read data bits that match the plurality of original write data bits.

According to preferred aspects of these memory devices, the plurality of stored data bits and the plurality of parity bits collectively form an N-bit word (i.e., m+p=N). A binary value of the plurality of syndrome bits may also equal an integer n. Based on this arrangement, the error correction circuit may correct an error in the plurality of stored data bits by inverting an nth bit of the N-bit word and then passing the corrected word as a plurality of read data bits that match the plurality of write data bits. According to other preferred aspects of these devices, the plurality of syndrome bits are generated by providing the plurality of stored data bits and the plurality of parity bits to a plurality of logic gates that perform an exclusive OR operation. In particular, each of the plurality of logic gates has inputs that receive at least two of the plurality of stored data bits and at least one of the plurality of parity bits. The error correction circuit may also comprise a decoder that receives the plurality of syndrome bits and has a plurality of decoder outputs. This decoder may comprise a plurality of NAND gates that receive various combinations of the syndrome bits and inverted versions of the syndrome bits as inputs. The error correction circuit may also comprise a data correction circuit therein that receives the plurality of stored data bits and is electrically connected to the plurality of decoder outputs. A preferred data correction circuit may comprise a plurality of data correction units. Each data correction unit may receive a respective one of the plurality of stored data bits at a first input thereof and a respective one of the plurality of decoder outputs at a second input thereof.

According to still further embodiments of the present invention, a synchronous semiconductor memory device may be provided having a memory cell block with a plurality of memory cells, the memory cell block including a data bit memory cell array, which stores m data bits, and a parity bit memory cell array, which stores p parity bits, and an on-chip ECC circuit for checking and correcting errors of the (m+p) bits which are read from the memory cell block. The ECC circuit includes an error check circuit for selectively performing an exclusive OR operation with respect to the (m+p) bits to generate syndrome data, and an error correction circuit for correcting a data bit at a position corresponding to the syndrome data in the (m+p) bits. The (m+p) bits, which are provided to the error check circuit, are (m+p) bits read from the memory cell block and stored in a first pipeline stage in response to a first clock signal. The (m+p) bits, which are provided to the error correction circuit, are bits output from the first pipeline stage and stored in a second pipeline stage in response to a second clock signal.

The present invention also provides an error check and correction method in a synchronous semiconductor memory device having a memory cell block with a plurality of memory cells, the memory cell block comprising a data bit memory cell array, which stores m data bits, and a parity bit memory cell array, which stores p parity bits, and an on-chip ECC circuit for checking and correcting errors of the (m+p) bits which are read from the memory cell block. The method includes the steps of storing the m data bits, which are input to a DQ pad in response to a write command received in synchronization with a clock signal, and the p parity bits corresponding to the m data bits in the data bit memory cell array and the parity bit memory cell array, respectively; simultaneously reading the m data bits from the data bit memory cell array and the p parity bits from the parity bit memory cell array in response to a read command, which is received in synchronization with a clock signal, and outputting the (m+p) bits to a data line; transmitting the (m+p) bits over the data line to a first pipeline stage responsive to a first clock signal; providing an output of (m+p) bits of the first pipeline stage to an error check circuit and selectively performing an exclusive OR operation with respect to the (m+p) bits in response to a second clock signal to generate syndrome data; outputting the output of (m+p) bits of the first pipeline stage to a second pipeline stage responsive to the second clock signal; and providing an output of (m+p) bits of the second pipeline stage to an error correction circuit and correcting data of bits at positions corresponding to the syndrome data in the (m+p) bits.

As described above, the ECC circuit of a synchronous semiconductor device according to the present invention checks the output of the first pipeline stage, that is, an ECC word having a relatively small number of bits, for errors, and generates syndrome data, thereby reducing the overhead of an ECC operation block. Consequently, the ECC circuit does not impede the rapid operation of a pipeline.

BRIEF DESCRIPTION OF THE DRAWINGS

The above objectives and advantages of the present invention will become more apparent by describing in detail a preferred embodiment thereof with reference to the attached drawings in which.

DESCRIPTION OF PREFERRED EMBODIMENTS

Figure 1:
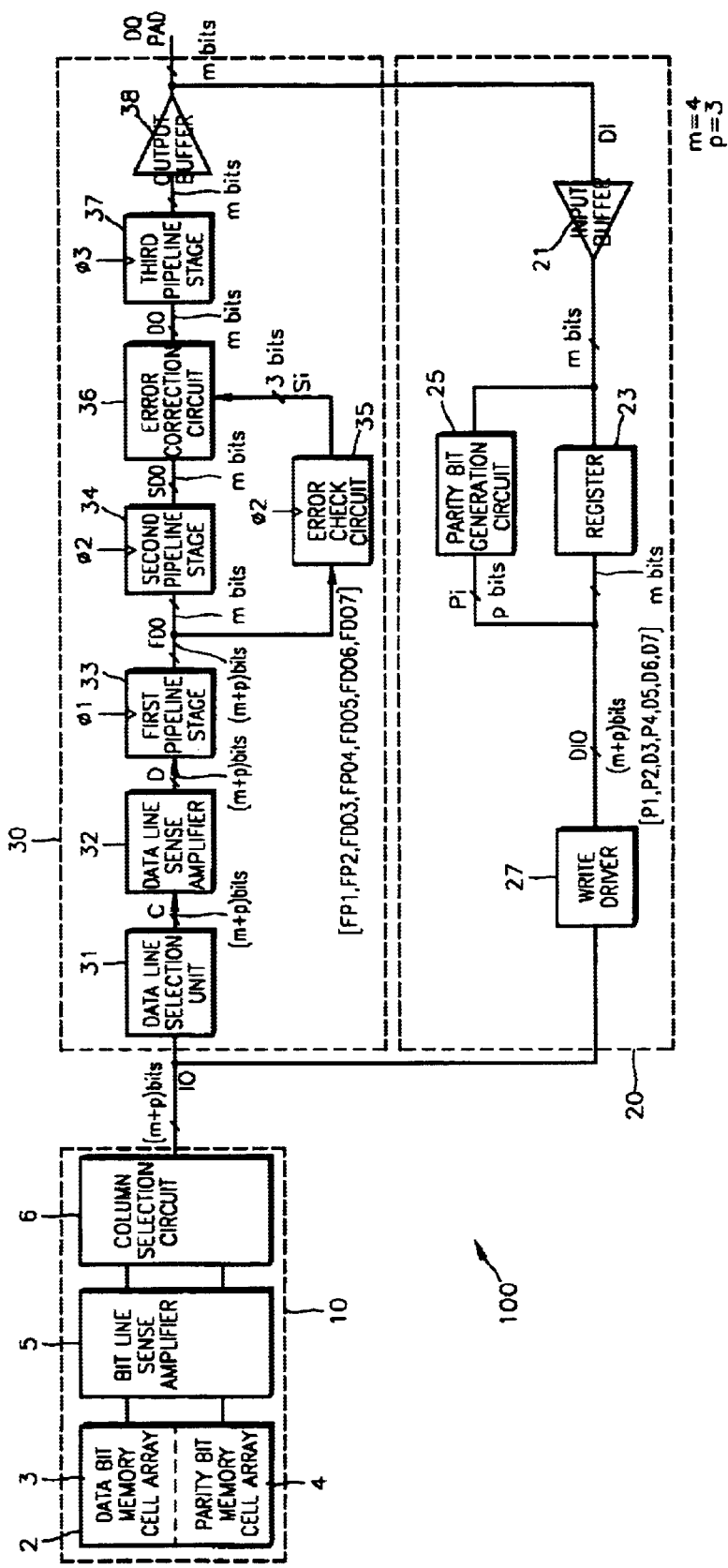
FIG. 1 is a block diagram of a synchronous semiconductor memory device having an error check and correction (ECC) circuit according to an embodiment of the present invention.

The present invention will now be described more fully with reference to the accompanying drawings, in which preferred embodiments of the invention are shown. The same reference numerals in different drawings represent the same element. The description of the present invention concerns a synchronous DRAM (SDRAM) having a pipeline data structure, in which the SDRAM operates in synchronization with a clock signal and previously generates internal data to support the high speed of data which is input from or output to the outside. The composition of input/output data bits of different SDRAMs varies, but this specification describes a case in which input/output data bits are composed of m (=4) bits and parity bits are composed of p (=3) bits corresponding to the m (=4) bits.

FIG. 1 is a diagram of a synchronous semiconductor memory device having a error check and correction (ECC) circuit according to an embodiment of the present invention. Referring to FIG. 1, a synchronous semiconductor memory device 100 includes a memory block 10, a data writing path block 20 and a data reading path block 30.

The memory block 10 includes a memory cell block 2 composed of a plurality of memory cells which are arranged in row and column directions. The memory cell block 2 includes a data bit memory cell array 3 and a parity bit memory cell array 4. Data of m bits is stored in the data bit memory cell array 3, and p parity bits are stored in the parity bit memory cell array 4.

The data of memory cells, which are selected by the activation of a predetermined word line (not shown) in the memory cell block 2, is transmitted to a column selection circuit 6 via a bit line sense amplifier 5 for sensing and amplifying bit line data. Thereafter, among a plurality of bit line data, which are sensed by the bit line sense amplifier 5, data of predetermined bit lines, that is, bit line data of (m+p) bits is selected by the column selection circuit 6, which responds to a column selection signal (not shown) for selecting bit lines, and transmitted to a data line 10.

In the data writing path block 20, a plurality of data bits (m (=4) bits), which are input to a data pad, namely, a DQ pad, are provided to a data input buffer 21. The m (=4) bits of input data DI are provided to a register 23 and a parity bit generation circuit 25 from the data input buffer 21. The data register 23 stores and outputs the input data DI of m (=4) bits, and the parity bit generation circuit 25 generates parity data Pi of p (=3) bits, thereby constituting internal write data DIO of (m+p) (=7) bits. Thereafter, the internal write data DIO of (m+p) (=7) bits is provided to a write driver 27.

Subsequently, the internal write data DIO of (m+p) (=7) bits is written to memory cells within the memory cell block 2.

In the data reading path block 30, a data line 10 of (m+p) (=7) bits, which are selected by the column selection circuit 6 in the memory block 10, is connected to a data line sense amplifier 32 via a data line selection unit 31. The data line sense amplifier 32 senses and amplifies the voltage level of data C of (m+p) (=7) bits. Output D of (m+p=7) bits of the data line sense amplifier 32 is provided to a first pipeline stage 33 responding to a first clock signal φ1. Output FDO of (m+p) (=7) bits of the first pipeline stage 33 is provided to an error check circuit 35. The output FDO of (m+p) (=7) bits of the first pipeline stage 33 is also provided to a second pipeline stage 34 responding to a second clock signal φ2. Here, among the (m+p) (=7) bits output from the first pipeline stage 33, only the m bits corresponding to data bits can be provided to the second pipeline stage 34.

The error check circuit 35 selectively performs an exclusive OR operation with respect to the output FDO of (m+p) (=7) bits of the first pipeline stage 33 so as to generate syndrome data Si. The syndrome data Si is information indicating the position of a data bit having an error in an ECC word. In this description, three bits of syndrome data Si are used to represent the position information of each bit of the (m+p) (=7) bits. The syndrome data Si is provided to an error correction circuit 36, and the error correction circuit 36 corrects the value of a bit corresponding to the syndrome data Si among the (m+p) (=7) bits of output SDO of the second pipeline stage 34. Thereafter, the error correction circuit 36 outputs only the data bit DO of m (=4) bits. The output DO of m (=4) bits of the error correction circuit 36 is provided to a third pipeline stage 37 responding to a third clock signal φ3 and then output to the DQ pad via an output buffer 38.

The following description concerns the operation of the synchronous semiconductor memory device of FIG. 1.

Figure 2:
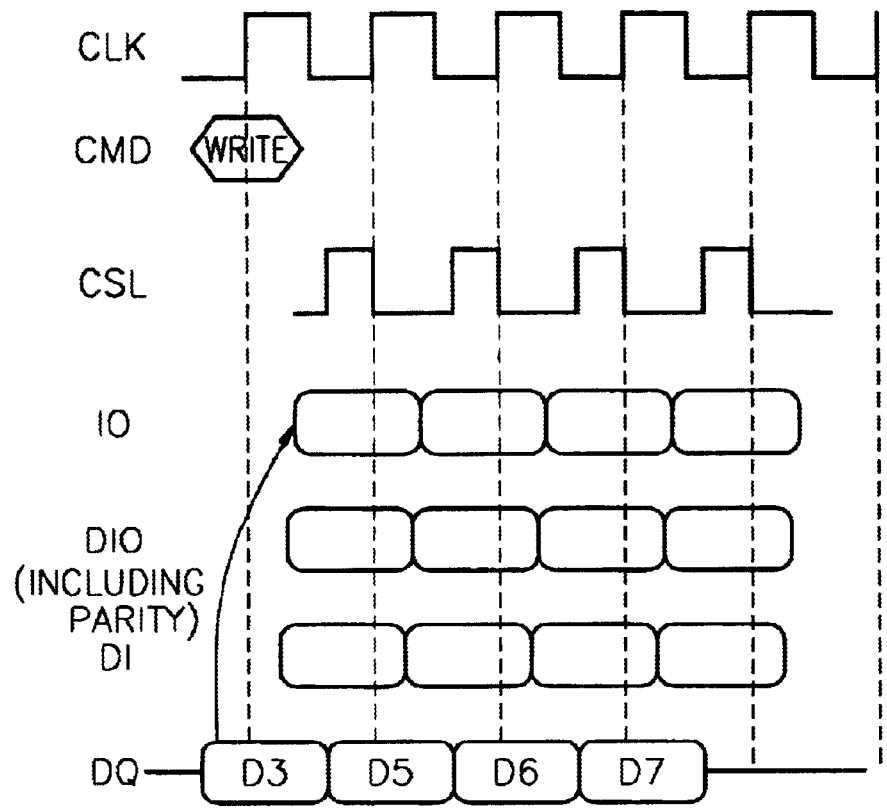
FIG. 2 is a timing diagram showing the write operation of the synchronous semiconductor memory device of FIG. 1.

The write operation to the memory cell block 2 is shown in FIG. 2. Referring to FIGS. 1 and 2, data DI of m (=4) bits, which is input to the DQ pad in response to a write command CMD which is received in synchronization with a clock signal CLK, is transmitted via the internal write data DIO line and the data bit 10 line in the data writing path block 20 and stored in the data bit memory cell array 3 according to a column selection signal CSL. Simultaneously, p (=3) parity bits Pi corresponding to the data bit DI of m (=4) bits are generated by the parity bit generation circuit 25 and stored in the parity bit memory cell array 4.

For illustrative purposes, an ECC word is assumed to be a 7-bit composition which is composed of m (=4) data bits and p (=3) parity bits. In this specification, an ECC word is composed of bits P1, P2, D3, P4, D5, D6 and D7. Accordingly, the bits D3, D5, D6 and D7 correspond to m (=4) data bits, and the bits P1, P2 and P4 correspond to p (=3) parity bits. The parity bit generation circuit 25 is shown in FIG. 3.

Figure 3:
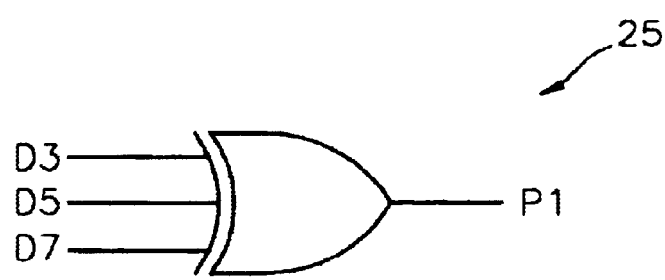
FIG. 3 is a circuit diagram schematically showing a parity bit generation circuit of FIG. 1.

Referring to FIG. 3, the parity bit generation circuit 25 selectively performs an exclusive OR operation with respect to m (=4) input data bits D3, D5, D6 and D7 to generate p (=3) parity bits. In other words, an exclusive OR operation is performed with respect to the input data bits D3, D5 and D7 to generate a parity bit P1. A parity bit P2 is generated by performing an exclusive OR operation with respect to the input data bits D3, D6 and D7. A parity bit P4 is generated by performing an exclusive OR operation with respect to the input data bits D5, D6 and D7.

Figure 4:
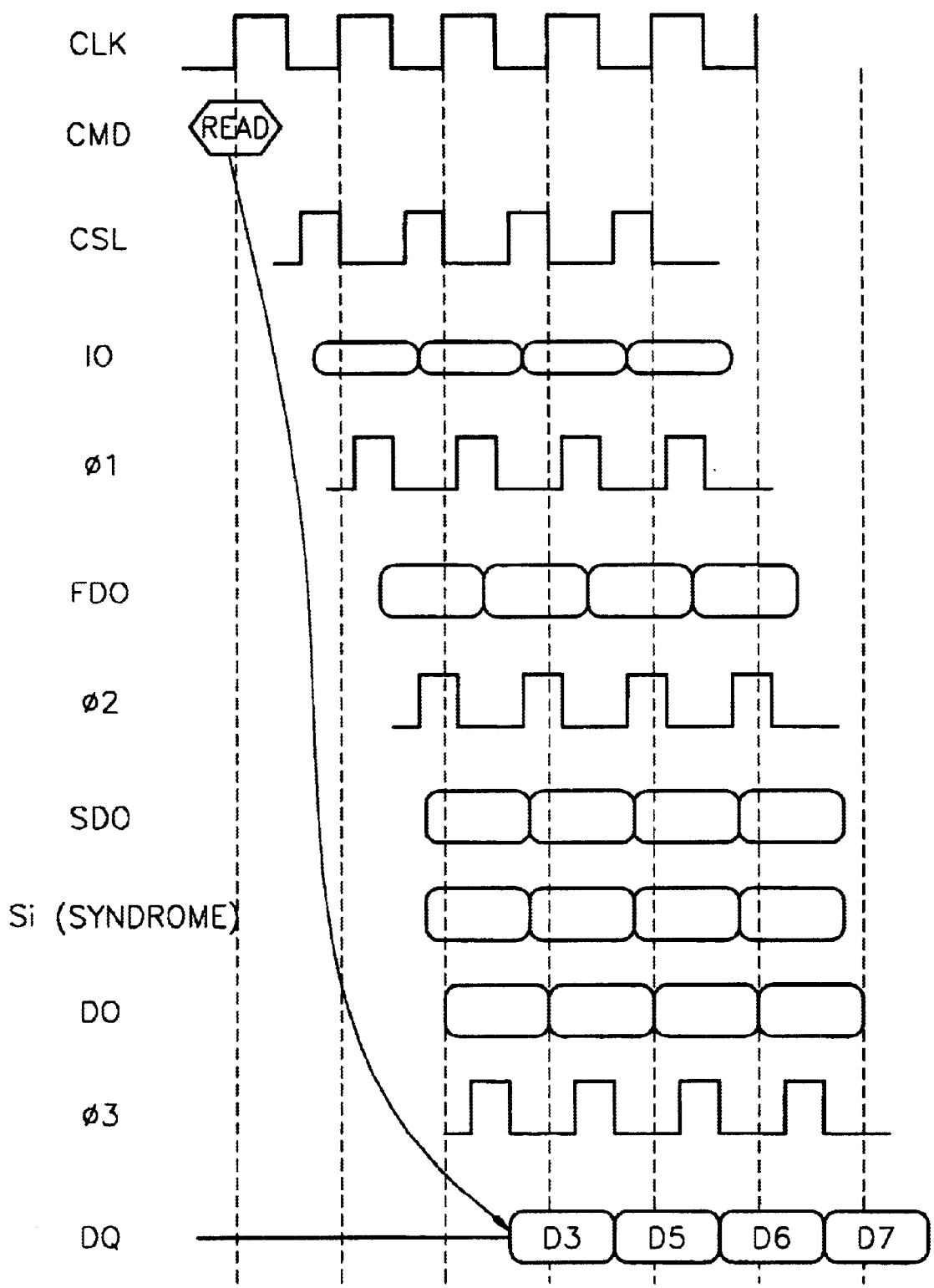
FIG. 4 is a timing diagram showing the read operation of the synchronous semiconductor memory device of FIG. 1.

Referring to FIG. 1, the operation of reading data from the memory cell block 2 is shown in FIG. 4. As shown in FIGS. 1 and 4, data IO of (m+p) (=7) bits, which correspond to a column selection signal CSL in response to a read command CMD which is received in synchronization with a clock signal CLK, is read from the memory cell block 2. The m (=4) bits of the data IO are read from the data bit memory cell array 3 of FIG. 1, and, simultaneously, the p (=3) bits of the data IO are read from the parity bit memory cell array 4 of FIG. 1. Thereafter, the (m+p) (=7) bits of the data IO are output to the first pipeline stage 33 responsive to a first clock signal φ1 via the data line selection unit 31 and the data line sense amplifier 32 in the data reading path block 30. The output FDO of (m+p) (=7) bits of the first pipeline stage 33 is provided to the error check circuit 35 to generate syndrom data Si. The error check circuit is shown in FIG. 5.

Figure 5:
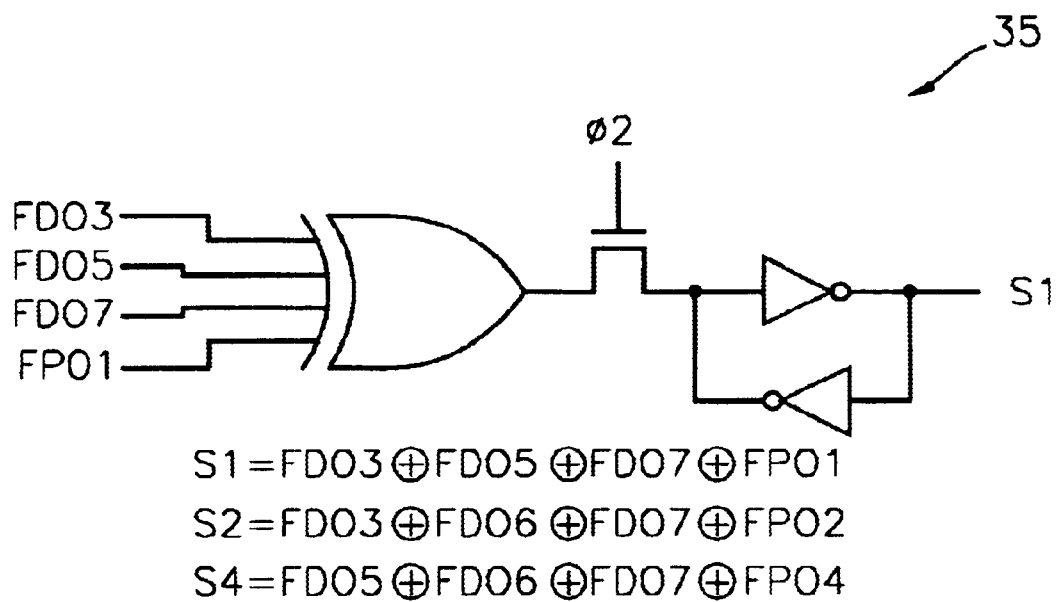
FIG. 5 is a circuit diagram schematically showing an error check circuit of FIG. 1.

Referring to FIG. 5, the error check circuit 35 checks whether bit information of an ECC word of (m+p) (=7) bits P1, P2, D3, P4, D5, D6 and D7 has an error. The error check circuit 35 selectively performs an exclusive OR operation with respect to the output (m+p) (=7) bits of the first pipeline stage 33 of FIG. 1, FPO1, FPO2, FDO3, FPO4, FDO5, FDO6 and FDO7, to generate the syndrome data Si of three bits.

More specifically, an exclusive OR operation is performed with respect to the bits FDO3, FDO5, FDO7 and FPO1 among the (m+p) (=7) output bits of the first pipeline stage 33, and the result thereof is latched in response to a second clock signal φ2 to generate first syndrome data S1. An exclusive OR operation is performed with respect to the bits FDO3, FDO6, FDO7 and FPO2, and the result thereof is latched in response to a second clock signal φ2 to generate second syndrome data S2. An exclusive OR operation is performed with respect to the bits FDO5, FDO6, FDO7 and FPO4, and the result thereof is latched in response to a second clock signal φ2 to generate third syndrome data S3. The number of bits of syndrome data is 3 in this description. This is because an ECC word in the embodiment of the present invention is composed of 7 bits. The minimum number of bits necessary for representing the position of each bit in the ECC word of 7 bits is three. Accordingly, as the number of bits of an ECC word varies, the number of bits of syndrome data also varies.

Returning to FIG. 4, the output FDO of (m+p) (=7) bits of the first pipeline stage 33 is transmitted to the second pipeline stage 34 of FIG. 1 responsive to the second clock signal φ2. The output SDO of (m) (=4) bits of the second pipeline stage 34 is corrected by the error correction circuit 36 of FIG. 1, which corrects bit information at a position corresponding to the syndrome data Si provided by the error check circuit 35 described above. Thereafter, the data DO of m (=4) bits is output as the result of the correction. The circuit diagram of the error correction circuit 36 of FIG. 1 is shown in FIG. 6.

Figure 6:
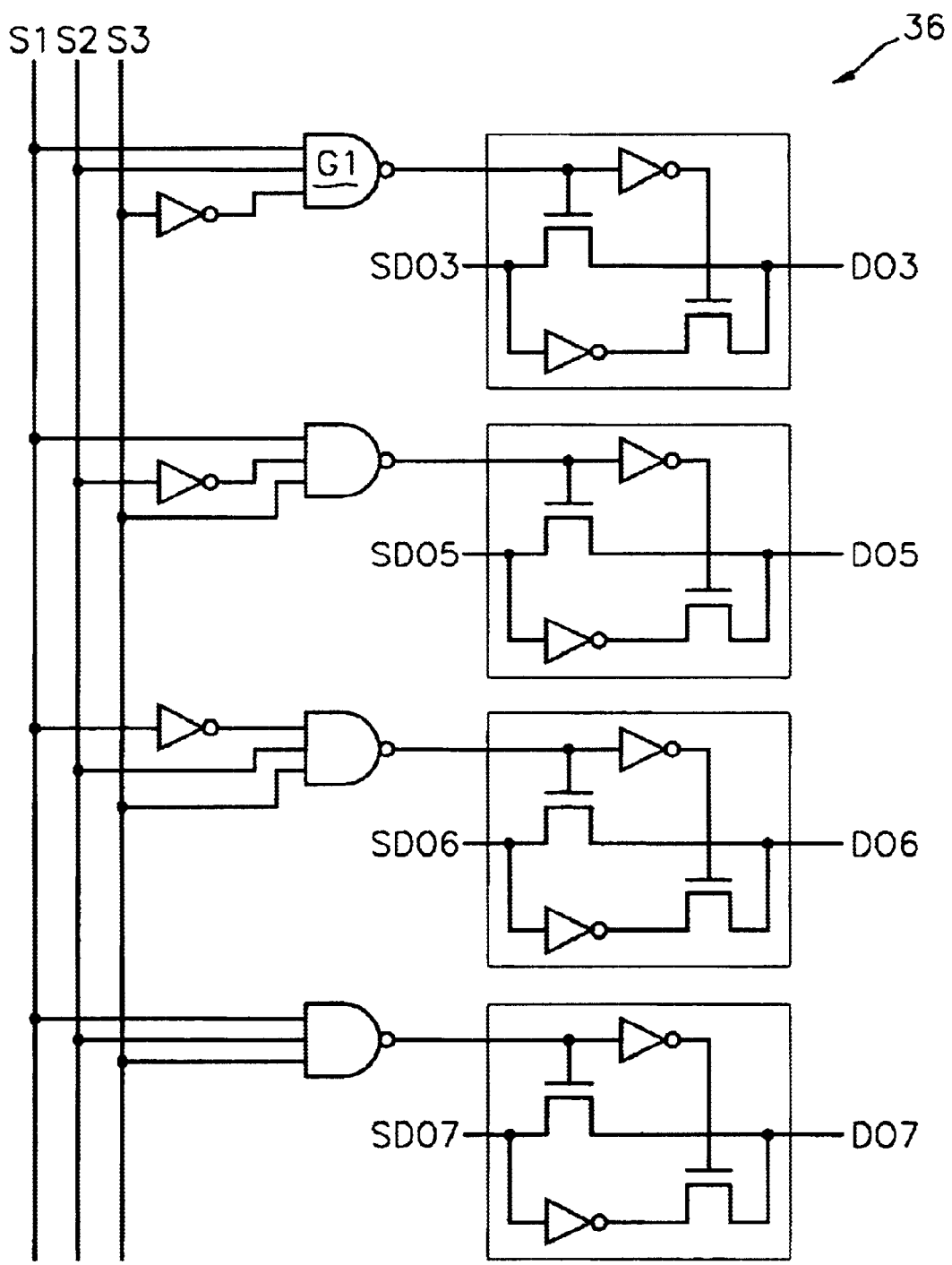
FIG. 6 is a circuit diagram schematically showing an error correction circuit of FIG. 1.

In the error correction circuit 36 of FIG. 6, the syndrome data S1, S2 and S3 of 3 bits indicate an error position in the m data bits output from the second pipeline stage 34 of FIG. 1. In the event the second pipeline stage 34 also outputs p parity bits, these parity bits are ignored by the error correction circuit 36.

Accordingly, in the error correction circuit, when the output NA of a three-input NAND gate G1 receiving the syndrome data S1, S2 and S3 has a logic value of "1", there is no error at a position which is represented by the syndrome data S1, S2 and S3. When the output NA of the three-input NAND gate G1 has a logic value of "0", there is an error at the position which is represented by the syndrome data S1, S2 and S3. When the logic value of the output NA of the three-input NAND gate G1 is "1", a transistor TNA is turned on, and the output SDO of the second pipeline stage 34 of FIG. 1 is transmitted to the data line DO without change. When the logic value of the output NA of the three-input NAND gate G1 is "0", an inverted output NB of the output NA turns on a transistor TNB, and an inverted value of the output SDO of the second pipeline stage 34 is transmitted to the data line DO. In this manner, the error correction circuit 36 corrects errors based on the syndrome data Si.

Compared with the conventional ECC circuits which impede rapid operation because many bits of an ECC word cause an operation time to become long, ECC circuits according to the present invention check the output FDO of the first pipeline stage 33 of FIG. 1, which is composed of m input/output data bits and p parity bits corresponding to the number of input/output data bits, that is, an ECC word having relatively the smaller number of bits, for errors, and generate syndrome data Si as a result of the check. Consequently, the present invention reduces the overhead of an ECC operation block, and thus the ECC circuits of the present invention do not impede the rapid operation of a pipeline.

Thus, as described above, preferred integrated circuit memory devices may comprise a memory cell array 2 having therein a plurality of stored data bits and a plurality of parity bits generated from a plurality of write data bits received by the memory device during a write operation. The plurality of stored data bits and the plurality of parity bits may collectively form a word having a length of m+p (=7) bits, where m (=4) and p (=3) are integers. An error check circuit 35 is also provided. As illustrated by FIG. 5, the error check circuit 35 converts the plurality of stored data bits and the plurality of parity bits into a plurality of syndrome bits (e.g., S1, S2 and S3) that designate a location of a bit error in the plurality of stored data bits when compared against the original write data bits. These original write data bits may be received without error by an input buffer 21 within the memory device and the stored data bits may have error therein (relative to the write data bits) that was generated during the write operation. These preferred memory devices also preferably comprise an error correction circuit 36 that uses the plurality of syndrome bits to correct an error in the plurality of stored data bits after the correction and generate a plurality of read data bits that match the plurality of original write data bits. These read data bits may be provided to an output buffer 38, in response to a read operation.

According to preferred aspects of these devices, the plurality of stored data bits and the plurality of parity bits collectively form an N-bit word, where NN=7 in the illustrated embodiments described by FIGS. 1–6. A binary value of the plurality of syndrome bits may also equal an integer n. Based on this arrangement, the error correction circuit 36 may correct an error in the plurality of stored data bits by inverting an nth bit of the N-bit word and then passing the corrected word as a plurality of read data bits that match the plurality of write data bits. For example, if the syndrome bits S3, S2 and S1 equal {110}, then the $6^{th}$ most significant bit of the 7-bit word (FDO7, FDO6, FDO5, FPO4, FDO3, FPO2, FPO1) is inverted to correct an error with the $6^{th}$ bit. Alternatively, if the syndrome bits S3, S2 and S1 equal {101}, then the $5^{th}$ most significant bit of the 7-bit word is corrected. In a similar fashion, if the syndrome bits S3, S2 and S1 equal {011}, then the $3^{rd}$ most significant bit of the 7-bit word is corrected. Finally, if the syndrome bits S3, S2 and S1 equal {111}, then the $7^{th}$ most significant bit of the 7-bit word is corrected.

According to additional preferred aspects of these devices, the plurality of syndrome bits are generated by providing the plurality of stored data bits and the plurality of parity bits to a plurality of logic gates that perform an exclusive OR operation, as illustrated by FIG. 5. In particular, each of the plurality of logic gates has inputs that receive at least two of the plurality of stored data bits and at least one of the plurality of parity bits. The error correction circuit 36 may also comprise a decoder that receives the plurality of syndrome bits and has a plurality of decoder outputs. This decoder may comprise a plurality of 3-input NAND gates that receive various combinations of the syndrome bits and inverted versions of the syndromes bits as inputs. The error correction circuit 36 may also comprise a data correction circuit therein that receives the plurality of stored data bits (SDO3, SDO5, SDO6 and SDO7) and is electrically connected to the plurality of decoder outputs. A preferred data correction circuit may comprise a plurality of data correction units 40A–40D. Each data correction unit may receive a respective one of the plurality of stored data bits at a first input thereof and a respective one of the plurality of decoder outputs at a second input thereof.

While this invention has been particularly shown and described with reference to preferred embodiments thereof, it will be understood by those skilled in the art that various changes in form and details may be made therein without departing from the spirit and scope of the invention as defined by the appended claims.

That which is claimed is:

1. An integrated circuit memory device, comprising:
   a memory cell array having a plurality of entries therein that comprise a plurality of data bits and a plurality of parity bits;
   a first pipeline stage that is configured to latch-in data bits and parity bits read from said memory cell array, in-sync with a first clock signal;
   a second pipeline stage that is configured to latch-in data bits output from said first pipeline stage, in-sync with a second clock signal;
   an error check circuit that is configured to receive data bits and parity bits output from said first pipeline stage, said error check circuit configured to operate in parallel with said second pipeline stage by generating syndrome data in-sync with the second clock signal; and
   an error correction circuit electrically coupled to an output of said second pipeline stage and an output of said error check circuit, said error correction circuit configured to generate corrected read data in response to data bits output from said second pipeline stage and the syndrome data generated by said error check circuit in parallel with the data bits output from said second pipeline stage.

2. The memory device claim 1, wherein said error correction circuit comprises:
   a decoder having a plurality of inputs that are configured to receive the syndrome data generated by said error check circuit; and
   a plurality of data correction units that are configured to generate the corrected read data in response to the data bits output from said second pipeline stage and signals generated at outputs of said decoder.

* * * * *